United States Patent [19]
Wei

[11] Patent Number: 5,736,869
[45] Date of Patent: Apr. 7, 1998

[54] OUTPUT DRIVER WITH LEVEL SHIFTING AND VOLTAGE PROTECTION

[75] Inventor: Shuran Wei, St. Paul, Minn.

[73] Assignee: LSI Logic Corporation, Milpitas, Calif.

[21] Appl. No.: 645,644

[22] Filed: May 16, 1996

[51] Int. Cl.[6] ............................................. H03K 19/0185
[52] U.S. Cl. .............................. 326/81; 326/83; 327/543
[58] Field of Search .............................. 326/80–81, 68, 326/70–71, 83, 86; 327/541, 543

[56] References Cited

U.S. PATENT DOCUMENTS

| | | |
|---|---|---|
| 5,266,849 | 11/1993 | Kitahara et al. |
| 5,300,832 | 4/1994 | Rogers . |
| 5,321,324 | 6/1994 | Hardee et al. ............ 326/80 |
| 5,338,978 | 8/1994 | Larsen et al. . |
| 5,406,141 | 4/1995 | Yero et al. ............ 326/83 |
| 5,410,267 | 4/1995 | Haycock et al. ............ 326/81 |
| 5,418,476 | 5/1995 | Strauss ............ 326/58 |
| 5,450,025 | 9/1995 | Shay ............ 326/81 |
| 5,467,031 | 11/1995 | Nguyen et al. ............ 326/81 |
| 5,537,059 | 7/1996 | Asahina ............ 326/83 |
| 5,559,464 | 9/1996 | Orii et al. ............ 326/81 |

*Primary Examiner*—Jon Santamauro
*Attorney, Agent, or Firm*—Westman, Champlin & Kelly, P.A.

[57] ABSTRACT

An output driver circuit according to the present invention provides level shifting and self-biased voltage protection. The output driver circuit includes first and second complementary data terminals, an output terminal. A pull-up and a pull-down transistor are coupled to the output terminal and have first and second control terminals, respectively. The second control terminal is coupled to the second data terminal. A differential transistor pair has control terminals coupled to the first and second data terminals, respectively, and defines first and second current paths. A cross coupled transistor pair is coupled in the first and second current paths and has a control output terminal coupled to the control terminal of the pull-up transistor. A self-biased voltage protection transistor is coupled between the pull-up transistor and the output terminal and has a control terminal coupled to the second current path, between the differential transistor pair and the cross coupled transistor pair. The output driver circuit can be adapted to provide 3.3V drive capability in a 2.5V fabrication process or 5.0V drive capability in a 3.3V fabrication process, for example.

13 Claims, 4 Drawing Sheets

5,736,869

1

OUTPUT DRIVER WITH LEVEL SHIFTING AND VOLTAGE PROTECTION

BACKGROUND OF THE INVENTION

The present invention relates to semiconductor integrated circuits and, more particularly, to an output driver having a level shifted output and voltage protection.

Advancements in semiconductor integrated circuit fabrication technology enable the geometries of circuit devices to be progressively reduced so that more devices can fit on a single integrated circuit. However, certain types of devices are more susceptible to size reductions than other devices. Generally, the geometries of memory circuits are being reduced at a faster rate than are the geometries of logic circuits that are coupled to the memory circuits.

Transistor-transistor-logic (TTL) devices are conventionally powered from 5V power supplies. However, a problem is encountered in attempting to power memory circuits having smaller feature sizes from a 5V power supply. The upper limit of gate oxide field strength, for the case of silicon dioxide gates, is about 3 mV/cm. The maximum allowable voltage across a gate oxide layer of about 150 Å thickness is therefore approximately 4V. If a 5V signal is applied to the gate of a small geometry CMOS memory device; the gate oxide can break down and the device can be destroyed.

CMOS memory and other devices are being designed for operation with reduced voltage power supplies to prevent damage to devices having small feature sizes and to reduce overall power consumption. For example, power supplies are now being reduced from 5V to 3.3V. Power supplies are also being reduced even further from 3.3V to 2.5V. However, low voltage CMOS memory devices must be operatively interconnected to TTL logic and other devices that operate at higher supply voltages of 5V or 3.3V. Often; these devices must be connected to a common input/output line.

Generally, a CMOS device is provided with a tri-state output driver circuit that is selectively operable between a normal drive mode and a tri-state or high impedance mode in which the driver circuit appears transparent to the output terminal to which it is connected. If no precautions are taken, an external 5V TTL level signal applied to the output terminal of a 3.3V tri-state driver can cause destruction of the driver due to the gate oxide break down effect discussed above.

U.S. Pat. No. 5,467,031, assigned to LSI Logic Corporation, discloses a 3.3V CMOS tri-state driver circuit capable of driving a 3.3V output signal on a common 5V line. The circuit includes a PMOS pull-up transistor and an NMOS pull-down transistor that are connected to the output terminal. The pull-up transistor is formed on an N-well which has a substrate terminal. A switching transistor is controlled to connect the N-well to the power supply in the drive mode to ensure stable and strong pull-up drive. A pass-gate transistor is biased to turn off the switching transistor when the voltage at the output terminal is higher than the power supply voltage in the high impedance mode, causing the N-well to float. This prevents leakage current from flowing through a semiconductor junction from the output terminal to the N-well through the pull-up transistor. A shorting transistor is controlled to short the gate of the pull-up transistor to the N-well when the voltage at the output terminal is higher than the power supply voltage in the high impedance mode, thereby preventing leakage current from flowing through the channel of the pull-up transistor.

2

Although this circuit protects the transistors in the circuit from overvoltages at the output terminals this circuit is not capable of driving a 5V swing at the output terminal.

SUMMARY OF THE INVENTION

The output driver circuit of the present invention includes first and second complementary data terminals, an output terminal. A pull-up and a pull-down transistor are coupled to the output terminal and have first and second control terminals, respectively. The second control terminal is coupled to the second data terminal. A differential transistor pair has control terminals coupled to the first and second data terminals, respectively, and defines first and second current paths. A cross coupled transistor pair is coupled in the first and second current paths and has a control output terminal coupled to the control terminal of the pull-up transistor. A self-biased voltage protection transistor is coupled between the pull-up transistor and the output terminal and has a control terminal coupled to the second current path, between the differential transistor pair and the cross coupled transistor pair. The output driver circuit can be adapted to provide 3.3V drive capability in a 2.5V fabrication process or 5.0V drive capability in a 3.3V fabrication process, for example.

In one embodiment, the cross coupled transistor pair and the differential transistor pair include p-channel transistors; with n-channel voltage protection transistors coupled between the cross coupled transistor pair and the differential transistor pair. In another embodiment, the differential transistor pair includes n-channel transistors, with n-channel voltage protection transistors coupled to the differential transistor pair and with p-channel voltage protection transistors coupled between the cross coupled transistor pair and the n-channel voltage protection transistors.

DETAILED DESCRIPTION OF THE PREFERRED EMBODIMENTS

Figure 1:
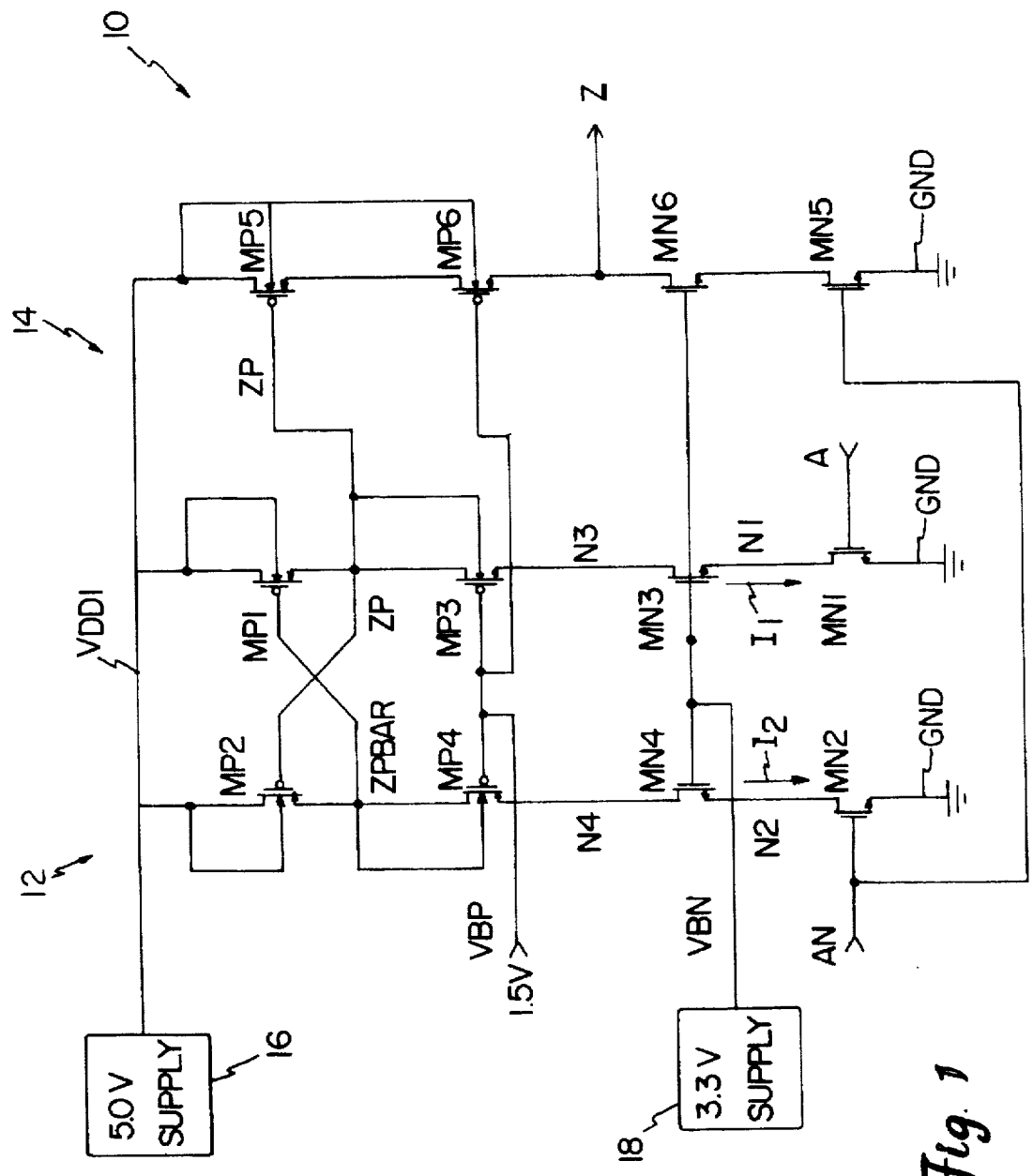
FIG. 1 is a schematic diagram of an output driver circuit according to the present invention.

The output driver of the present invention is used to drive the outputs of a semiconductor integrated circuit. The output driver allows the integrated circuit to interface efficiently with other devices operating at higher voltage levels by providing voltage level shifting, voltage protection, and zero DC power consumption. FIG. 1 is a schematic diagram of an output driver according to one embodiment of the present invention. Output driver 10 forms part of an integrated circuit which has been fabricated with a 3.3V fabrication process, for example. The internal components of the integrated circuit (not shown) provide 0 to 3.3V complementary data signals on data terminals A and AN. Output driver 10 supplies a 0 to 5V output signal on output terminal Z in response to the 0 to 3.3V complementary data signals on data terminals A and AN.

Output driver 10 is coupled to four voltage supply or reference terminals VDDI, GND, VBN and VBP. Voltage supply terminal VDD1 is coupled to a 5V power supply 16. Voltage supply terminal GND is coupled to ground (i.e. 0V). N-channel voltage supply terminal VBN is a reference terminal which is coupled to a 3.3V reference level, such as an internal 3.3V supply 18 of the integrated circuit. P-channel voltage supply terminal VBP is a reference terminal which is coupled to a 1.5–2.0V bias generator. The bias generator is discussed in greater detail below with reference to FIG. 3.

Output driver 10 includes predriver stage 12 and output driver stage 14. Each transistor in predriver stage 12 and output driver stage 14 are biased such that the gate-to-source, gate-to-bulk and gate-to-drain voltages are all kept smaller than 3.6V to prevent damage to the transistors while driving or receiving 0 to 5V data signals on output terminal Z.

Predriver stage 12 includes n-channel differential transistor pair MN1 and MN2, n-channel voltage protection transistors MN3 and MN4, p-channel cross-coupled transistor pair MP1 and MP2 and p-channel voltage protection transistors MP3 and MP4. The gates of transistors MN1 and MN2 are coupled to complementary data terminals A and AN, respectively. The sources of transistors MN1 and MN2 are coupled to voltage supply terminal GND. The drains of transistors MN1 and MN2 define first and second current paths I1 and I2 within predriver stage 12, at circuit nodes N1 and N2. The gates of voltage protection transistors MN3 and MN4 are coupled to voltage supply terminal VBN, which is at 3.3V. The sources of transistors MN3 and MN4 are coupled to the drains of transistors MN1 and MN2, respectively. The drains of transistors MN3 and MN4 are coupled to circuit nodes N3 and N4, respectively.

The gates of voltage protection terminals MP3 and MP4 are coupled to voltage supply terminal VBP which is at about 1.5V to about 2.0V. The drains of transistors MP3 and MP4 are coupled to the drains of transistors MN3 and MN4, respectively. The sources and substrate terminals of transistors MP3 and MP4 are coupled to circuit nodes ZP and ZPBAR, respectively. Transistors MP1 and MP2 are cross-coupled to one another with the gate of transistor MP1 coupled to the drain of transistor MP2 at node ZPBAR and the gate of transistor MP2 coupled to the drain of transistor MP1 at node ZP. The sources of transistors MP1 and MP2 are coupled to voltage supply terminal VDD1, which is at 5.0V.

Output driver stage 14 includes p-channel pull-up transistor MP5, n-channel pull-down transistor MN5, p-channel voltage protection transistor MP6 and n-channel voltage protection transistor MN6, which are coupled together in series between voltage supply terminals VDD1 and GND. Pull-down transistor MN5 has a gate coupled to data terminal AN, a source coupled to voltage supply terminal GND and a drain coupled to the source of voltage protection transistor MN6. Voltage protection transistor MN6 has a gate coupled to voltage supply terminal VBN and a drain coupled to output terminal Z. Voltage protection transistor MP6 has a gate coupled to voltage supply terminal VBP, a source coupled to the drain of pull-up transistor MP5 and a drain coupled to output terminal Z. pull-up transistor MP5 has a gate coupled to node ZP, a source coupled to voltage supply terminal VDD1 and a substrate coupled to voltage supply terminal VDD1.

During operation, the data on data terminals A and AN control the voltage level on output terminal Z by switching pull-up and pull-down transistors MP5 and MN5 on and off either to pull output terminal Z up to 5.0V or down to 0V.

In a traditional output driver, the gates of transistors MP5 and MN5 are driven by the same voltage levels, such as 0–3.3V. When the voltage level is high, pull-down transistor MN5 is on and pull-up transistor MP5 is off. When the voltage level is low, pull-down transistor MN5 is off and pull-up transistor MP5 is on.

With the present invention, pull-down transistor MN5 is driven with a voltage level of 0–3.3V while pull-up transistor MP5 is driven with a level-shifted voltage of about 2.4–5.0V. This protects pull-up transistor MP5 and pull-down transistor MN5 from experiencing gate-to-source, gate-to-drain and gate-to-bulk voltage drops of greater than 3.6V.

Predriver stage 12 performs the level shifting while protecting each of the transistors in the predriver stage from overvoltage conditions. If data terminal A is high and data terminal AN is low, transistor MN1 will be on and transistor MN2 will be off. Transistor MN1 pulls current through current path I1, which discharges nodes N1, N3 and ZP toward 0V. Since the sources of transistors MP1 and MP2 are tied to 5.0V, the voltage at nodes ZP and ZPBAR should be held above a certain minimum, such as 2.4V, to prevent an overvoltage condition on transistors MP1 and MP2. As node ZP discharges to about 2.4V, the gate-to-source voltage of voltage protection transistor MP3 drops below the p-channel threshold voltage $V_{TP}$ (about 0.9V) since the gate is tied to at least 1.5V. Transistor MP3 turns off and thereafter prevents further discharge of node ZP. The voltage swing at circuit node ZP is therefore limited to greater than 2.4V.

As node ZP goes low, the gate of transistor MP2 goes low which turns on transistor MP2. Transistor MP2 charges nodes ZPBAR, N4 and N2 toward 5.0V. The high level on node ZPBAR turns off transistor MP1. As node N2 charges to about 2.8V, transistor MN4 turns off since its gate-to-source voltage drops below the n-channel threshold voltage $V_{TN}$ of 0.5V with its gate tied to 3.3V. This prevents further charging of node N2 and thereby limits the drain-to-gate and drain-to-source voltage drops of across transistor MN2.

Referring to output driver stage 14, the logic low level on node ZP turns on pull-up transistor MP5, which pulls output terminal Z toward 5V in accordance with the logic high level (3.3V) on data terminal A. The logic low level (0V) on data terminal AN turns off pull-down transistor MP5. When output terminal Z is at 5.0V, voltage protection transistor MN6 protects pull-down transistor MN5 from large voltage drops from its drain terminal to its gate and source terminals. As the drain of transistor MN5 rises to about 2.8V, voltage protection transistor MN6 turns off since its gate is held at 3.3V. This prevents further charging of the drain of transistor MN5 from charging above 2.8V.

When data terminal A is low and data terminal AN is high, transistor MN1 is off and transistor MN2 is on. Transistor MN2 discharges nodes N2, N4 and ZPBAR toward 0V. When nodes ZPBAR and N4 drop to about 2.4V, voltage protection transistor MP4 turns off since its gate is tied to about 1.5V, which prevents further discharge of node ZPBAR. The low voltage on ZPBAR turns on transistor MP1, which charges nodes ZP, N3 and N1. The high voltage on node ZP turns off transistor MP2. As node N1 charges to about 2.8V, voltage protection transistor MN3 turns off since its gate is tied to 3.3V, which prevents further charging of node N1. This protects transistor MN1 from large voltage drops.

At output driver stage 14, the high voltage on node ZP turns off pull-up transistor MP6. The high voltage on data terminal AN turns on pull-down transistor MN5 which discharges output terminal Z to 0V. As the drain of pull-up transistor MP5 and the source of voltage protection transistor MP6 drop to about 2.4V, transistor MP6 turns off since its gate is tied to about 1.5V. This prevents further discharge of the drain of pull-up transistor MP5 and protects transistor MP5 from large voltage drops when output terminal Z is 0V.

Figure 2:
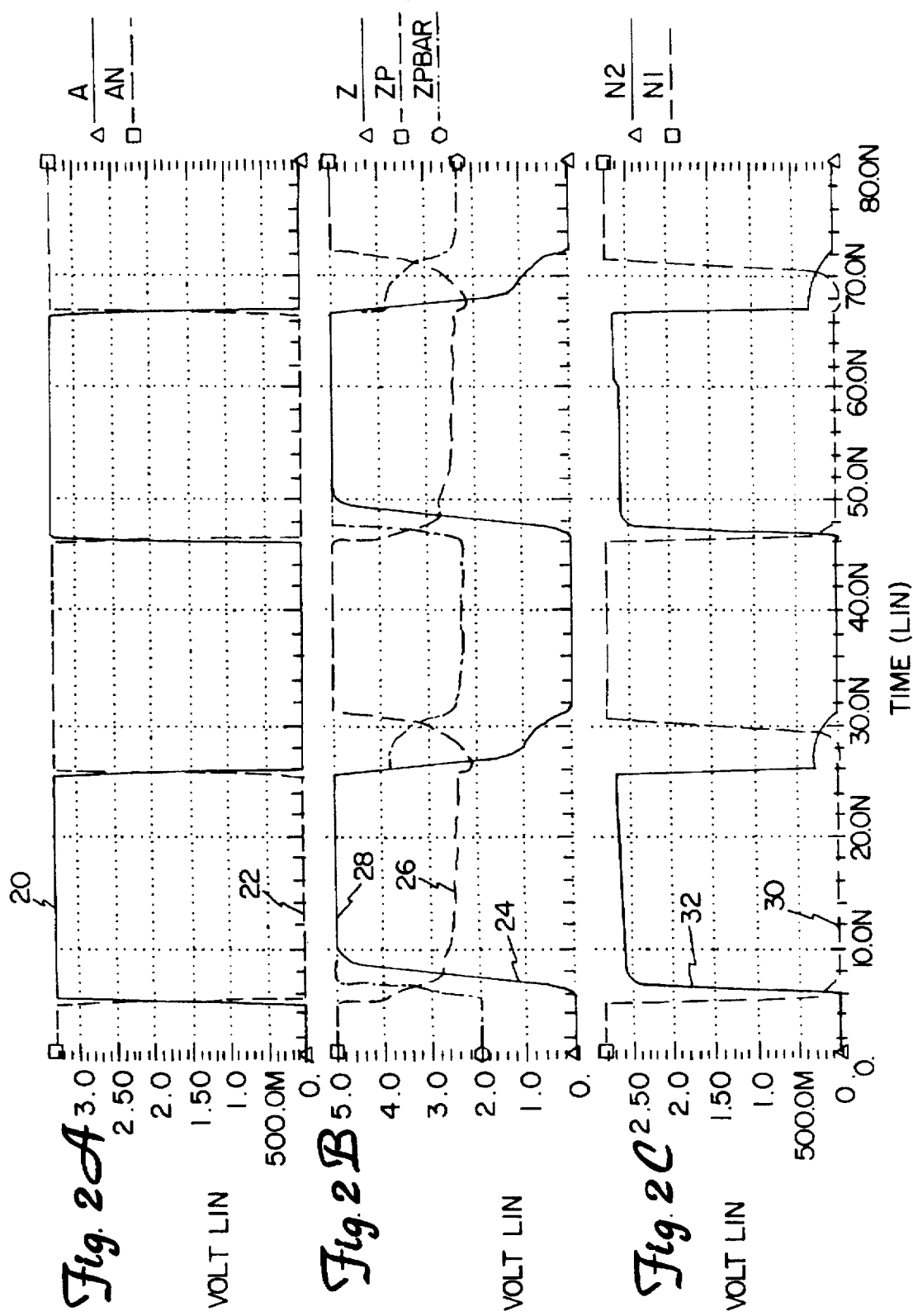
FIGS. 2a–2c are graphs illustrating the voltage at various circuit nodes in output driver circuit over time.

FIGS. 2a-2c illustrate modeled HSPICE simulation results of the voltages at various nodes in the circuit shown in FIG. 1 over time. In FIG. 2a, line 20 represents a data signal applied to complementary data terminal A. Line 22 represents a data signal applied to complementary data terminal AN. Data terminals A and AN have complementary voltage levels which toggle between 0 and 3.3V.

In FIG. 2b, lines 24, 26 and 28 represent the voltages on output terminal Z, circuit node ZP and circuit node ZPBAR, respectively. As the voltage on data terminal A (line 20) toggles from 0 to 3.3V; the voltage on output terminal Z (line 28) toggles from 0 to 5.0V. The voltage on node ZP toggles from 5.0V to about 2.4V. The voltage on circuit node ZPBAR toggles from about 2.4 to 5V.

In FIG. 2c, lines 30 and 32 represent the voltages on nodes N1 and N2. Node N1 (line 30) toggles about 2.9V to about 0V. Node N2 (line 32) toggles from about 0V to about 2.6V. FIGS. 2a-2c show that the voltage drop across the gate-to-bulk, gate-to-source and gate-to-drain of every transistor in FIG. 1 is less than 3.6V.

Output driver circuit 10 therefore provides level shifting from a 3.3V input swing to a 5.0V output swing while providing voltage protection to teach transistor in the circuit. Each transistor can therefore be manufactured according to a 3.3V fabrication process, while still providing a 5.0V output drive capability. Also, the circuit consumes zero DC power.

The transistors shown in FIG. 1 can include a single transistor or an array of transistors connected in parallel to one another, depending on the desired drive capability. For example, output drive transistors MP5, MN6, MP5 and MP6 can each include an array of five transistors. The lengths and widths of each transistor can also be adjusted as desired. The following table provides an example of suitable transistor sizes:

TABLE 1

| Transistor | Width (in μm) | Length (in μm) |
| --- | --- | --- |
| MN1-MN4, MP1-MP4 | 5.0 | 0.4 |
| MN5, MN6 | 20.0 | 0.4 |
| MP5, MP6 | 30.0 | 0.4 |

Figure 3:
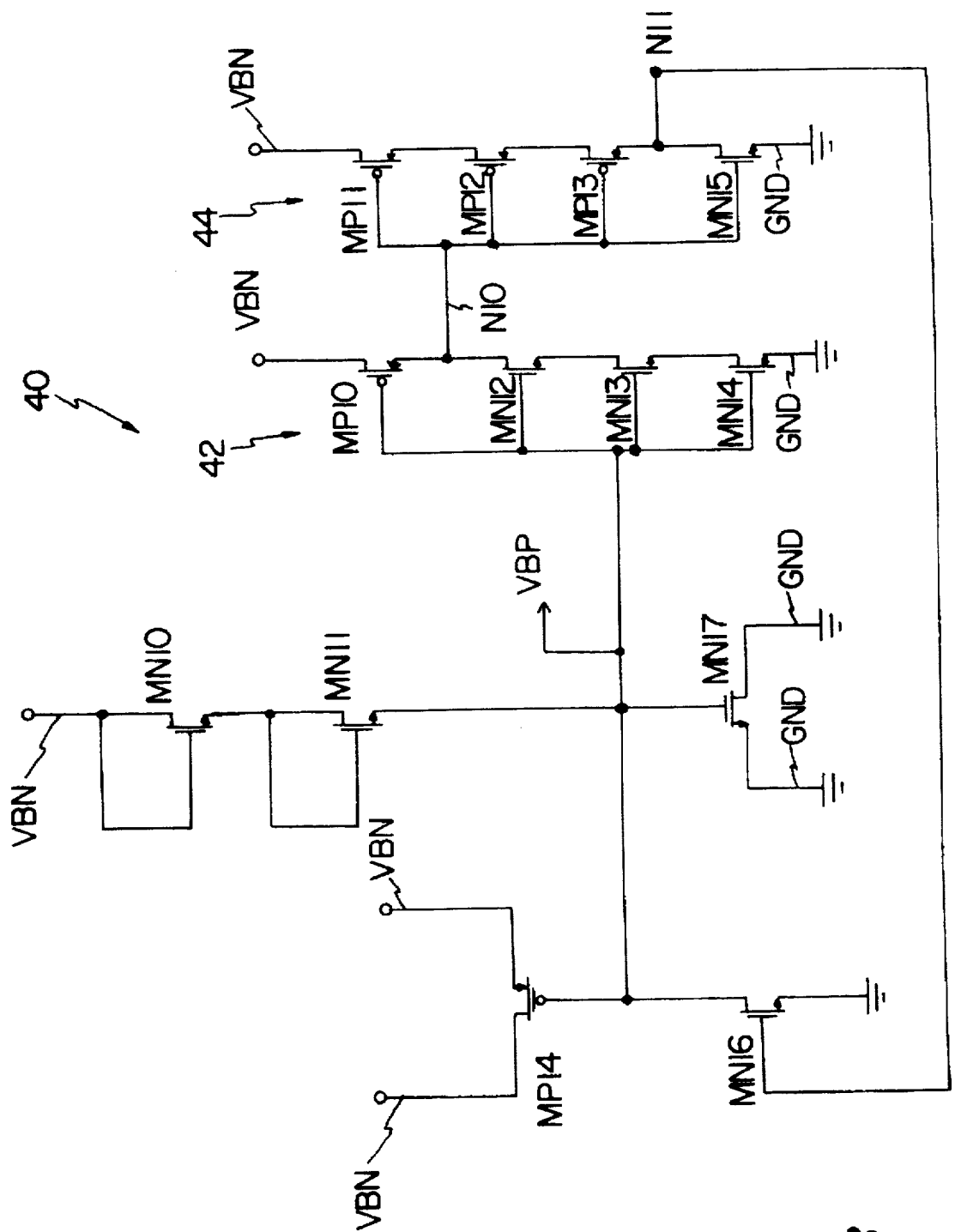
FIG. 3 is a schematic diagram of a bias generator for use with the circuit shown in FIG. 1.

FIG. 3 is a schematic diagram of a bias generator for use with the circuit shown in FIG. 1 of the present invention. Bias generator 40 generates a bias voltage of about 1.5V-2.0V on voltage supply terminal VBP without consuming any DC power. Bias generator 40 includes n-channel diode connected pull-up transistors MN10 and MN11 which are coupled together in series between voltage supply terminal VBN (3.3V) and voltage supply terminal VBP. An inverter 42 is coupled between voltage supply terminal VBP and circuit node N10. Inverter 42 includes n-channel transistors MN12, MN13 and MN14 and p-channel transistor MP10 which are connected together in series between voltage supply terminals VBN and GND. Node N10 is coupled between the drains of transistors MP10 and MN12.

Inverter 44 is coupled between nodes N10 and N11. Inverter 44 includes n-channel transistor MN15 and p-channel transistors MP11, MP12 and MP13, which are connected together in series between voltage supply terminals VBN and GND.

Node N11 is coupled between the drains of transistors MN15 and MP13 and the gate of discharge transistor MN16. Transistor MN16 has a source coupled to voltage supply terminal GND and a drain coupled to voltage supply terminal VBP. Bias generator 40 further includes capacitors formed by transistors MN17 and MP14. Transistor MN17 has a gate coupled to voltage supply terminal VBP and a source and a drain coupled to voltage supply terminal GND. Transistor MP14 has a gate coupled to voltage supply terminal VBP and a source and a drain coupled to voltage supply terminal VBN.

When voltage supply terminal VBP is below 1.8V, transistors MN10 and MN11 turn on and charge VBP back to about 1.5V. If, due to capacitive coupling, voltage supply terminal VBP is higher than about 2.0V (which is the selected threshold of inverter 42), inverters 42 and 44 turn on, which turns on discharge transistor MN16 to discharge voltage supply terminal VBP. Once voltage supply terminal VBP drops below 2.0V, inverters 42 and 44 turn off, which turns off discharge transistor MN16. Therefore, the voltage on voltage supply terminal VBP is maintained between approximately 1.5V and 2.0V without consuming any DC power.

Transistors MN10, MN11 and MP10 include arrays of three individual transistors connected together in parallel. Transistors MN16 and MP14 include arrays of twenty individual transistors connected together in parallel. The following table provides an example of suitable transistor sizes for the circuit shown in FIG. 3:

TABLE 2

| Transistor | Width (in μm) | Length (in μm) |
| --- | --- | --- |
| MN10-MN15 | 5.4 | 0.4 |
| MN16 | 5.4 | 3.0 |
| MP10-MP14 | 6.4 | 0.4 |

Figure 4:
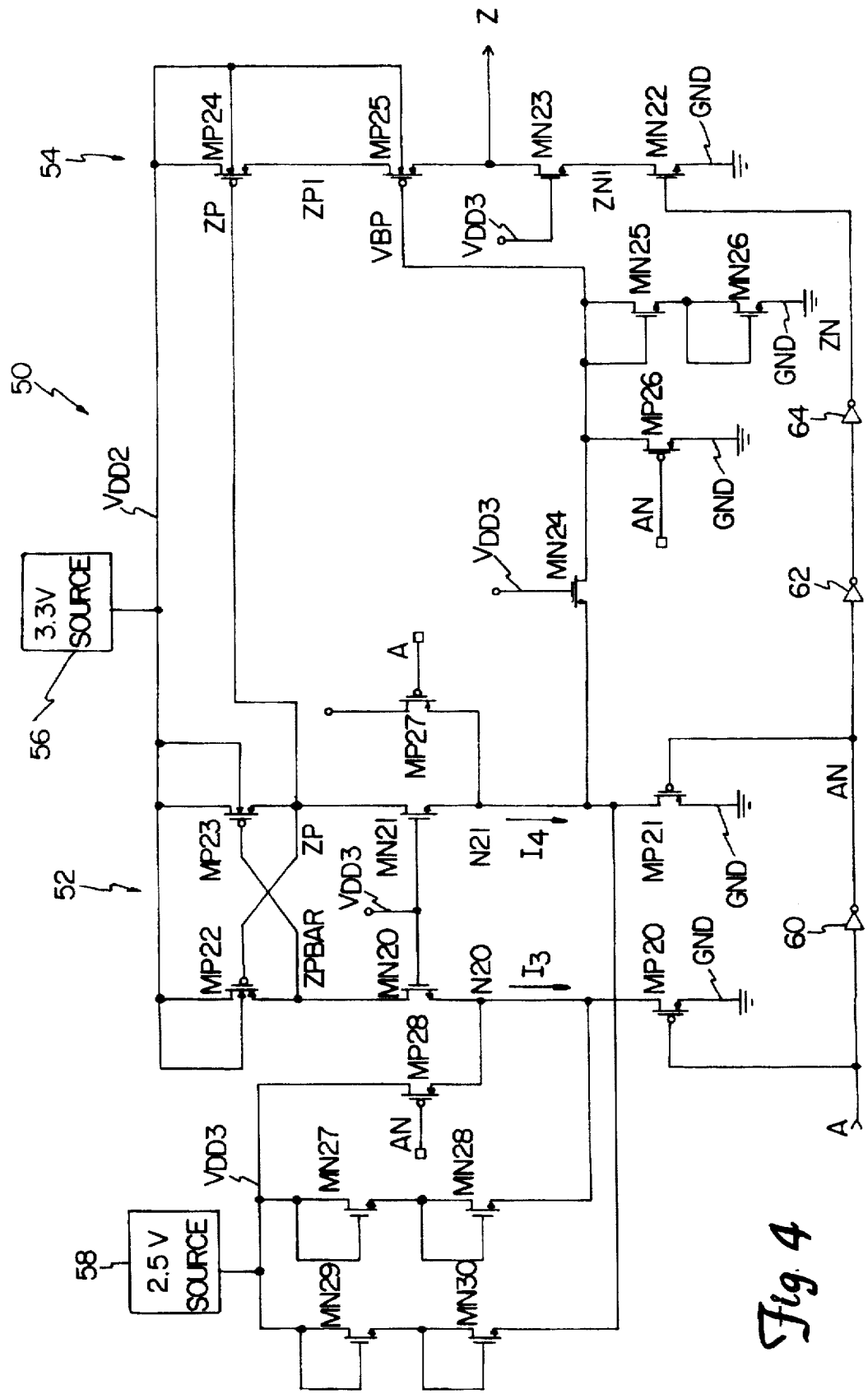
FIG. 4 is a schematic diagram of an output driver circuit according to an alternative embodiment of the present invention.

FIG. 4 is a schematic diagram of an output driver circuit according to an alternative embodiment of the present invention. Output driver circuit 50 is manufactured with a 2.5V process, as opposed to a 3.3V process, and is capable of driving a 3.3V output on output terminal Z. Also, output driver circuit 50 has a self-biased voltage supply terminal VBP. No separate bias generator is required.

Output driver circuit 50 includes predriver stage 52 and output driver stage 54 which are coupled between voltage supply terminal VDD2 and voltage supply terminal GND. Voltage supply terminal VDD2 is coupled to a 3.3V source 56 within the integrated circuit containing output driver circuit 50. Output driver circuit 50 is also coupled to voltage supply terminal VDD3: which is coupled to a 2.5V source 58.

Predriver stage 52 includes p-channel differential transistor pair MP20 and MP21, n-channel voltage protection transistors MN20 and MN21, and p-channel cross-coupled transistor pair MP22 and MP23. Differential transistor pair MP20 and MP21 define first and second current paths I3 and I4 through circuit nodes N20 and N21. Transistor MP20 has a gate coupled to data terminal A, a drain coupled to voltage supply terminal GND and a source coupled to the source of voltage protection transistor MN20, at node N20. Transistor MP21 has a gate coupled to data terminal AN, a drain coupled to voltage supply terminal GND and a source coupled to the source of voltage protection transistor MN21, at node N21. Data terminals A and AN are coupled together through an inverter 60.

The gates of voltage protection transistors MN20 and MN21 are coupled to voltage supply terminal VDD3, which is at 2.5V. The drains of transistors MN20 and MN21 are coupled to the drains of transistors MP22 and MP23, at circuit nodes ZPBAR and ZP, respectively. Transistors MP22 and MP23 are cross-coupled to one another, with the gate of transistor MP22 coupled to the drain of transistors MP23 and the gate of transistor MP23 coupled to the drain of transistor MP22. The source and substrate terminals of transistors MP22 and MP23 are coupled to voltage supply terminal VDD2.

Output driver stage 54 includes p-channel pull-up transistor MP24, p-channel voltage protection transistor MP25, n-channel pull-down transistor MN22 and n-channel voltage protection transistor MN23. Pull-up transistor MP24 has a gate coupled to node ZP, a source and a substrate coupled to voltage supply terminal VDD2 and a drain coupled to the source of voltage protection transistor MP25, at node ZP1. Voltage protection transistor MP25 has a gate coupled to voltage supply terminal, or reference terminal, VBP, a substrate coupled to the substrate of transistor MP24 and a drain coupled to output terminal Z. Voltage protection transistor MN23 has a gate coupled to voltage supply terminal VDD3, a source coupled to the drain of pull-down transistor MN22, at node ZN1, and a drain coupled to output terminal Z. Pull-down transistor MN22 has a gate coupled to data terminal AN through inverters 62 and 64 and a source coupled to voltage supply terminal GND. Voltage supply terminal VBP is coupled to node N2 in current path I4 through n-channel transistor MN24. Transistor MN24 has a gate coupled to voltage supply terminal VDD3.

In operation, predriver stage 52 and output driver stage 54 operate in a similar manner as predriver stage 12 and output driver stage 14 of the embodiment shown in FIG. 1. As the data on data terminal A toggles between 0 and 2.5V, differential transistor pair MP20 and MP21 steer current through current paths I3 and I4. When data terminal A is a logic high and data terminal AN is a logic low, transistor MP20 is off and transistor MP21 is on. Transistor MP21 discharges circuit nodes N21 and ZP toward 0V. When node ZP drops to about 2.5V, the drain-to-gate voltage of transistor MN21 becomes negative, at which time transistor MN21 turns off, preventing further discharge of circuit node ZP. The low voltage on node ZP turns on transistor MP22 which charges nodes ZPBAR and N20 toward 3.3V. The high voltage on node ZPBAR turns off transistor MP23. As node N20 reaches about 2.0V, transistor MN20 turns off since its gate is tied to 2.5V and thereafter prevents further charging of node N20.

In output driver stage 54, the logic low level on data terminal AN results in a logic low level at the gate of transistor MN22, which turns off transistor MN22. The low level on node ZP and the gate of transistor MP24 turns on transistor MP24, which charges node ZP1, output terminal Z and node ZN1 toward 3.3V. As node ZN1 reaches 2.0V, voltage protection transistor MN23 turns off since its gate is tied to 2.5V. This prevents further charging of node ZN1, which protects pull-down transistor MN22 from an overvoltage condition.

Likewise, when data terminal A is low and data terminal AN is high, transistor MP20 is on and transistor MP21 is off. Transistor MP20 discharges nodes N20 and ZPBAR toward 0V. As node ZPBAR drops to about 2.5V, transistor MN20 turns off, preventing further discharge of node ZPBAR and thereby protecting transistors MP22 and MP23 from an overvoltage condition. The low voltage on node ZPBAR turns on transistor MP23, which charges nodes ZP and N21 toward 3.3V and turns off transistor MP22. As node N21 reaches about 2.0V, transistor MN21 turns off since its gate is tied to 2.5V. This prevents further charging of node N21 and thereby protects transistor MP21 from an overvoltage condition.

The high voltage on node ZP turns off pull-up transistor MP24 while the high voltage on data terminal AN turns on pull-down transistor MN22. Transistor MN22 discharges node ZN1, output terminal Z and node ZP toward 0V. As node ZP1 drops below the voltage on the gate of voltage protection transistor MP25, transistor MP25 turns off, preventing further discharge of node ZP1 and an overvoltage condition on transistor MP24.

The gate of transistor MP25 at voltage supply terminal VBP ranges from about 1.0 to 2.0V and is self-biased by predriver stage 52. VBP is held above about 1.0V by transistors MP21 and MN24, which have small voltage drops when transistor MP21 pulls node N21, and thus VBP low. VBP is held below about 2.0V by transistor MN24. As node N21 rises to about 2.0V, transistor MN24 turns off since its gate is tied to 2.5V, which prevents further charging of VBP. The self-bias feature of node VBP can also be implemented in the embodiment shown in FIG. 1 by coupling transistor MN24 to node N1 in FIG. 1, for example.

Output driver circuit 50 includes further elements which optimize performance of the circuit. Transistor MP26 helps pull voltage supply terminal VBP down to about 1.0V when output terminal Z is at 3.3V. Transistor MP26 has a gate coupled to data terminal AN, a source coupled to voltage supply terminal VPB and a drain coupled to voltage supply terminal GND. When data terminal A is a logic high, data terminal AN is a logic low, which turns on transistor MP26, thereby pulling voltage supply terminal VBP toward 1.0V.

Transistors MN25 and MN26 are diode connected n-channel transistors which are connected together in series between voltage supply terminal VBP and voltage supply terminal GND. Transistors MN25 and MN26 supply a very weak pull-down current which assists in defining a correct bias voltage for VBP during start-up. During normal operation, transistors MN25 and MN26 have little effect.

P-channel transistor MP27 has a gate coupled to data terminal A, a source coupled to voltage supply terminal VDD3 and a drain coupled to node N21. Transistor MP27 is a pull-up transistor which assists transistor MP23 in charging node N21 when the voltage level on data terminal A is low. Similarly, transistor MP28 has a gate coupled to data terminal AN, a source coupled to voltage supply terminal VDD3 and a drain coupled to node N20. Transistor MP28 assists transistor MP22 in charging node N20 when the voltage on data terminal AN is a logic low.

Transistors MN27 and MN28 are n-channel diode connected transistors which are coupled together in series between voltage supply terminal VDD3 and node N20. Transistors MN29 and MN30 are n-channel diode connected transistors which are coupled together in series between voltage supply terminal VDD3 and node N21. Transistors MN27–MN30 help set correct bias points for nodes N20 and N21 during startup but have a negligible effect during normal operation.

Output driver circuit 50 provides level shifting from 0–2.5V at data terminals A and AN to 0–3.3V at output terminal Z while protecting each transistor in the circuit from large voltages. The gate-to-source, gate-to-drain and gate-to-bulk voltage drops for each transistor are kept to less than 2.75V.

The transistors in output driver circuit 50 can include individual transistors or an array of transistors coupled together in parallel with one another. In one embodiment, transistor MP26 includes an array of two transistors; transistors MP20, MP27 and MN20 include arrays of three transistors; transistor MP23 includes an array of four transistors; transistors MN21 and MN24 include arrays of six transistors; transistor MP21 includes an array of eight transistors; transistors MP24, MP25, MN22 and MN23 include arrays of fourteen transistors.

The following table provides examples of transistor sizes according to one preferred embodiment of the present invention:

TABLE 3

| Transistor | Width (in μm) | Length (in μm) |
|---|---|---|
| MN20, MN21, MN24 | 4.0 | 0.35 |
| MN22, MN23 | 25 | 0.35 |
| MN25–MN30 | 1.3 | 5.0 |
| MP20, MP21, MP26 | 5.0 | 0.35 |
| MP22, MP23 | 3.0 | 0.35 |
| MP24, MP25 | 40.0 | 0.35 |
| MP27, MP28 | 5.0 | 0.4 |

The output driver circuit of the present invention provides level shifting from a core voltage level to an external voltage level of an integrated circuit and provides voltage protection for each of the transistors in the circuit. The circuit consumes zero DC power. The circuit of the present invention can be used to shift between a variety of voltage levels. The 2.5 to 3.3V level shift and the 3.3 to 5.0V level shift discussed herein are provided as examples only. In one embodiment, the circuit is fabricated entirely with complementary metal-oxide semiconductor transistors.

Although the present invention has been described with reference to preferred embodiments, workers skilled in the art will recognize that changes may be made in form and detail without departing from the spirit and scope of the invention. For exampled the output driver circuit can be implemented with various technologies other than CMOS and with various circuit configurations. Also, the voltage supply terminals can be relatively positive or relatively negative, depending upon the particular convention adopted and the technology used. The terms "pull-up" and "pull-down" used in the specification and the claims are arbitrary terms and can refer to either a logic high level or a logic low level depending upon the relative levels of the voltage supply terminals. Likewise, the term "coupled" can include various types of connections or couplings and can include a direct connection or a connection through one or more intermediate components.

What is claimed is:

1. An output driver circuit comprising:
   first and second complementary data terminals;
   an pull-terminal;
   a pull-up transistor and a pull-down transistor which are coupled to the output terminal and have first and second control terminals, respectively, with the second control terminal coupled to the second data terminal;
   a differential transistor pair defining first and second current paths and having control terminals coupled to the first and second data terminals, respectively;
   a cross coupled transistor pair coupled in the first and second current paths and having a control output terminal coupled to the control terminal of the pull-up transistor; and
   a first voltage protection transistor coupled between the pull-up transistor and the output terminal and having a control terminal coupled to the second current path, between the differential transistor pair and the cross coupled transistor pair.

2. The output driver circuit of claim 1 wherein:
   the cross coupled transistor pair comprises first and second p-channel transistors which are coupled in the first and second current paths, respectively; and
   the differential transistor pair comprises third and fourth p-channel transistors which are coupled in the first and second current paths, respectively.

3. The output driver circuit of claim 2 and further comprising:
   a first voltage reference terminal having a selected voltage level, and
   second and third n-channel voltage protection transistors coupled in the first and second current paths, respectively, between the differential transistor pair and the cross coupled transistor pair and having control terminals coupled to the first reference voltage terminal.

4. The output driver circuit of claim 1 and further comprising:
   a first voltage reference terminal having a selected voltage level;
   a first charge boosting transistor coupled between the first voltage reference terminal and the first current path at a node between the cross coupled transistor pair and the differential transistor pair, wherein the first charge boosting transistors is biased by the second complementary data terminal; and
   a second charge boosting transistor coupled between the first voltage reference terminal and the second current path at a node between the cross coupled transistor pair and the differential transistor pair, wherein the second charge boosting transistors is biased by the first complementary data terminal.

5. The output driver circuit of claim 1 wherein the output driver stage further comprises:
   a first voltage reference terminal having a selected voltage level; and
   a second voltage protection transistor coupled between the output terminal and the pull-down transistor and having a gate terminal coupled to the first voltage reference terminal.

6. The output driver of claim 1 and further comprising:
   a first voltage reference terminal; and
   an n-channel transistor coupled between the control terminal of the first voltage protection transistor and the second current path and having a control terminal coupled to the first voltage reference terminal.

7. An output driver circuit comprising:
   first and second voltage supply terminals;
   first and second complementary data terminals;
   an output terminal;
   a pull-up transistor coupled between the first voltage supply terminal and the output terminal and having a first control terminal;

a pull-down transistor coupled between the second voltage supply terminal and the output terminal and having a second control terminal coupled to the second data terminal;

first and second predriver current paths;

a pull-down, p-channel differential transistor pair coupled between the second voltage supply terminal and the first and second current paths and having control terminals coupled to the first and second data terminals, respectively; and a p-channel cross coupled transistor pair coupled in the first and second current paths between the first voltage supply terminal and the differential transistor pair and having a control output terminal coupled to the control terminal of the pull-up transistor.

8. The output driver circuit of claim 7 and further comprising:

a first voltage reference terminal having a selected voltage level; and first and second n-channel voltage protection transistors coupled in the first and second current paths, respectively, between the differential transistor pair and the cross coupled transistor pair and having control terminals coupled to the first reference voltage terminal.

9. The output driver circuit of claim 7 and further comprising:

a first voltage protection transistor coupled between the pull-up transistor and the output terminal and having a control terminal coupled to the second current path, between the differential transistor pair and the cross coupled transistor pair.

10. The output driver of claim 9 and further comprising:

a first voltage reference terminal; and an n-channel transistor coupled between the control terminal of the first voltage protection transistor and the second current path and having a control terminal coupled to the first voltage reference terminal.

11. An output driver circuit comprising:

first and second complementary data terminals;

first, second and third reference voltage terminals;

an output terminal;

a pull-up transistor and a pull-down transistor which are coupled to the output terminal and have first and second control terminals, respectively, with the second control terminal coupled to the second data terminal;

first and second differential transistors defining first and second current paths and having control terminals coupled to the first and second data terminals, respectively;

first and second cross coupled transistors coupled in the first and second current paths, respectively, and having a control output terminal which is coupled to the control terminal of the pull-up transistor;

first and second voltage protection transistors coupled in the first and second current paths between the first and second differential transistors and the first and second cross coupled transistors, respectively, and having control terminals coupled to the first voltage reference terminal, and a bias circuit comprising:

at least one diode-connected transistor coupled between the second voltage reference terminal and the first voltage reference terminal;

a discharge transistor coupled between the first voltage reference terminal and the third voltage reference terminal and having a control terminal; and a buffer circuit coupled between the first voltage reference terminal and the control terminal of the discharge transistor.

12. The output driver circuit of claim 11 the buffer circuit comprises first and second inverters coupled together in series between the first voltage reference terminal and the control terminal of the discharge transistor.

13. The output driver circuit of claim 12 wherein:

the first inverter comprises a p-channel transistor coupled in series with three n-channel transistors between the second voltage reference terminal and the third voltage reference terminal; and the second inverter comprises three p-channel transistors coupled in series with an n-channel transistor between the second voltage reference terminal and the third voltage reference terminal.

* * * * *